(12) United States Patent
Hanamoto et al.

(10) Patent No.: US 7,176,143 B2
(45) Date of Patent: Feb. 13, 2007

(54) METHOD FOR EVALUATING SOLUTION FOR A COATING FILM FOR SEMICONDUCTORS

(75) Inventors: Yukio Hanamoto, Toyonaka (JP); Satoshi Yamamoto, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/948,162

(22) Filed: Sep. 24, 2004

(65) Prior Publication Data

US 2005/0095729 A1 May 5, 2005

(30) Foreign Application Priority Data

Sep. 26, 2003 (JP) ............................. 2003-334849

(51) Int. Cl.
*H01L 21/31* (2006.01)
(52) U.S. Cl. ................. 438/758; 438/781; 430/270.01; 257/E21.492
(58) Field of Classification Search ................ 438/758, 438/781; 257/E21.492; 430/270.1
See application file for complete search history.

(56) References Cited

U.S. PATENT DOCUMENTS

| | | | |
|---|---|---|---|
| 6,280,799 B1 * | 8/2001 | Okabe et al. ................ 427/466 |
| 6,450,190 B2 * | 9/2002 | Ohmi et al. .................... 137/14 |
| 6,800,569 B2 * | 10/2004 | Ito et al. ...................... 438/780 |
| 2002/0054702 A1 | 5/2002 | Wihl et al. |
| 2004/0170772 A1 * | 9/2004 | Morita ..................... 427/430.1 |
| 2004/0191674 A1 * | 9/2004 | Hanamoto et al. ........ 430/270.1 |
| 2005/0026456 A1 * | 2/2005 | Ito et al. ....................... 438/782 |
| 2006/0073411 A1 * | 4/2006 | Yamamoto et al. ....... 430/270.1 |

FOREIGN PATENT DOCUMENTS

JP 9-5228 A 1/1997

\* cited by examiner

*Primary Examiner*—Michael Lebentritt
*Assistant Examiner*—Stanetta Isaac
(74) *Attorney, Agent, or Firm*—Birch, Stewart, Kolasch & Birch, LLP

(57) ABSTRACT

The present invention provides a method for evaluating a solution for a coating film for semiconductor, which comprises measuring Clogging Degree of a solution for a coating film for semiconductor when the solution is filtrated through a filter having an average pore size of 0.01 to 0.4 μm, and estimating quality of the coating film formed from the solution,
wherein the Clogging Degree is defined by the following formula:

Clogging Degree=$V2/V1$

V1: A value of linear velocity of filtrate (filtrating rate per 1 cm$^2$ of filter (g/(cm$^2$·min)) at initial standard point in the case that a solution is filtrated at a fixed pressure and temperature
V2: A value of linear velocity of filtrate at the point the predetermined weight of filtrate discharged from the initial standard point According to the present method, quality of coating films can be figured out without actual formation of the coating films, and solutions for coating films can be evaluated thereby.

6 Claims, No Drawings

METHOD FOR EVALUATING SOLUTION FOR A COATING FILM FOR SEMICONDUCTORS

This nonprovisional application claims priority under 35 U.S.C. § 119(a) on Patent Application No. 2003-334849 filed in JAPAN on Sep. 26, 2003, the entire contents of which are hereby incorporated by reference.

BACKGROUND OF THE INVENTION

1. Field of the Invention

The present invention relates to a method for evaluating a solution for a coating film for semiconductor.

2. Related Art

Coating films for semiconductors such as photoresist patterns, interlayer dielectric film patterns, and the like, can be obtained by coating a solution (a solution for coating film) containing coating film-forming components in solvents, drying, and then, patterning such as irradiations and developments.

Recently, with progress in higher integration of integrated circuits, there occurs a requirement for formation of submicron patterns. Accompanying with this trends, there occurs a requirement for decrease of defects on coating film generated in forming coating film, though the defects had made no problem in the past but often makes serious influence to quality of the recent products obtained. Especially, in the fields requiring patterns having 100 nm or less, such as photoresists for KrF and photoresist for ArF, it is an imminent problem to be solved.

On the other hand, plurality of factors such as foreign objects can be supposed for the cause of deterioration of product quality due to the generation of defects on coating films, however, causal relationship can not precisely be understood yet. Therefore, in order to evaluate the solution for coating film, the coating film should be checked after actual formation of the film from the solution for coating film. In extreme cases, it is necessary to form coating films and to evaluate them in each series of production, it makes problem in the commercial productions of solution of coating film.

An object of the present invention is to provide a simple method for evaluation of solution for coating film for semiconductors, which can figure out the quality of coating film without actual formation of the coating film, and to provide a method capable of evaluating the solution for coating film thereby.

SUMMARY OF THE INVENTION

The present inventors have studied to solve the object and others, resultantly found out that the Clogging Degree of solution for coating film for semiconductors and quality of the coating film from the solution have close correlation and completed the present invention.

The present invention relates to the followings:

<1> A method for evaluating a solution for a coating film for semiconductor, which comprises measuring Clogging Degree of a solution for a coating film for semiconductor when the solution is filtrated through a filter having an average pore size of 0.01 to 0.4 μm, and estimating quality of the coating film formed from the solution, wherein the Clogging Degree is defined by the following formula:

Clogging Degree=$V2/V1$

V1: A value of linear velocity of filtrate (filtrating rate per 1 $cm^2$ of filter ($g/(cm^2 \cdot min)$) at initial standard point in the case that a solution is filtrated at a fixed pressure and temperature V2: A value of linear velocity of filtrate at the point the predetermined weight of filtrate discharged from the initial standard point <2> The method according to <1>, wherein the solution for a coating film for semiconductor is a photoresist composition.

<3> The method according to <1>, wherein the solution for a coating film for semiconductor is a photoresist composition for KrF or for ArF.

<4> The method according to any of <1> to <3>, wherein the filter is a track-etch membrane filter.

<5> The method according to any of <1> to <4>, wherein the average pore size of the filter is 0.01 to 0.2 μm, <6> The method according to any of <1> to <5>, wherein the predetermined weight of the filtrate discharged from the initial standard point is 2 to 50 g per 1 $cm^2$ of the filter converted to total weight of solid components in the filtrate.

DESCRIPTION OF PREFERRED EMBODIMENTS

The method of the present invention is the method for evaluating a solution for a coating film for semiconductor, which comprises measuring Clogging Degree of a solution for a coating film for semiconductor when the solution is filtrated through a filter having an average pore size of 0.01 to 0.4 μm, and estimating quality of the coating film formed from the solution.

Clogging Degree is a value calculated by the following formula.

Clogging Degree=$V2/V1$

V1: A value of linear velocity of filtrate (filtrating rate per 1 $cm^2$ of filter ($g/(cm^2 \cdot min)$) at initial standard point in the case that solution is filtrated at a fixed pressure and temperature V2: A value of linear velocity of filtrate at the point the predetermined weight of filtrate discharged from the initial standard point The linear velocity at initial standard point is a maximum value of linear velocity reached in a predetermined period after starting the filtration. Specifically, the filtrate discharged is collected in a receiver on a balance (weighing machine), and weight change of the filtrate is checked every one minute. Filtration time and accumulated weight of filtrate discharged are measured. The predetermined period is usually 10 minutes. The linear velocity is calculated by dividing the weight of filtrate discharged per one minute by effective filter area, then V1 and V2 are determined and Clogging Degree can be calculated.

The temperature in the measurement of Clogging degree is usually from about 20 to 30° C., preferably from 23 to 27° C., and the temperature is preferably maintained within a range of ±2° C.

Though the pressure can be determined according to filtration time needed, linear velocity of the filtrate, and the like, it is usually from about 20 to 200 kPa, preferably from about 50 to 100 kPa, and the pressure is preferably maintained within the range of ±5%.

The predetermined weight of filtrate discharged from the initial standard point in V2 can be described by "weight of filtrate (g)/effective filter area (cm$^2$)" and is usually 0.1 to 10 g/cm$^2$, preferably 0.5 to 5 g/cm$^2$ converted to total weight of solid components in the filtrate. The solid component means component other than solvents.

Average pore size of the filter used in the present method is 0.01 to 0.4 μm from the view point of efficiency of filtration and efficiency of capture, preferably 0.01 to 0.2 μm. The average pore size in the present method means the one measured by using images of scanning electron microscope when the filter used is a track-etch membrane filter. The average pore size means the one measured by a ASTM F316-80 porosimeter test method when the filter is a membrane filter other than the track-etch membrane filter.

As the filters used, membrane filters are preferred, especially track-etch membrane filters are especially preferred. The track-etch membrane filter is a filter whose pores pass straight through the membrane from front surface to back surface. The track-etch filter can be produced by a step of irradiating electron-charged particles to a material of filter, and subsequent etching step, and characteristics thereof is to have uniform, cylindrical and straight pores. The average pore size of the track-etch filters is precise, and higher reproducibility of value of Clogging degree tends to be obtained.

Examples of materials used for the filters include aliphatic polyamides, aromatic polyamides, polyether sulfones, polysulfones, sulfonated polysulfones, polyacrylonitriles, polyimides, polyvinyl alcohols, polyvinylidene fluorides, cellulose, cellulose acetates, polyethers, polytetrafluoroethylenes, polycarbonates, polypropylenes, polyethylene, polystyrenes, polyesters, ceramics, and the like.

Among the materials, the ones having resistance to the solvent used for solutions for coating semiconductors are preferred. Specifically, in the case of photoresist composition, polyethylene, polytetrafluoroethylenes and polycarbonates are especially preferred.

The quality of coating film for semiconductor when it is formed on a substrate using the solution of coating film for semiconductor can be estimated from the value of the Clogging Degree of said solution thus obtained.

The quality of the coating film can be evaluated by the number of defects formed on the coating film. In the case of resist compositions, for example, if the number of defects when resist patterns formed on an ordinary substrate for semiconductor with a diameter of 8 inches is less than 10, it is graded as E (Excellent). If the number is 10 to 100, it is graded as F (Fair). If the number is more than 100, it is graded as B (Bad).

If measurement of Clogging Degree of solution and evaluation of coating film formed from the solution are made in advance, estimation of quality of other coating film from other solution can easily be done by measuring Clogging Degree because there is a close correlation between Clogging Degree of a solution and evaluation of coating film formed from the solution as long as filtration conditions are substantially same. Evaluation of solution for coating film can be done thereby.

By Measurement of Cogging Degree of a solution, evaluation of coating film formed from the solution and grasp of the correlation therebetween in advance, it can also be used for checking some product whether it passes or fails in some standard without actually forming coating film in such a way that when the Clogging Degree of a solution is not less than the predetermined value, then the solution is 'pass' and when it is less than the value, then the solution is 'failure'. Therefore it can be applied to a means for checking of manufacturing steps in production facilities of solutions for coating films.

The solution for coating film for semiconductor means the one coated on a substrate using coater or patterns therefrom. Example thereof include photoresist compositions for forming patterns by radiation or heat, over coating materials solution for over coats by radiation or heat, antireflective materials solution by radiation or heat, or the like.

The photoresist composition used in the present method is the one dissolving photosensitive or photoinsensitive binder resin(s) in organic solvent(s), and other necessary additives can be contained. In the case that the binder polymer is photoinsensitive, the composition contains other photosensitive compounds.

Specific examples of thee photoresist compositions include positive photoresist compositions for g-line or i-line comprising novolac resins as binder and o-quinonediazides as photosensitizer; negative photoresist compositions for g-line or i-line comprising novolac resins as binder and azide compounds as photosensitizer; positive photoresist compositions for KrF or ArF excimer laser comprising vinylphenol resins or (meth)acrylic resins having groups dissociated by the action of acids as binder and acid generators generating acids by irradiation as sensitizer; negative photoresists for excimer laser compositions comprising alkalisoluble resins as binder such as novolac resins, polyvinylphenol resins and (meth)acrylic resins, acid generators as photosensitizer and crosslinking agent; photoresist compositions for electron beams comprising novolac resins or alkyl substituted polysulfone resins as photosensitive binder, and the like.

Further more the present method can be effectively applied to color resist compositions comprising photoresist compositions and dyes.

The photoresist compositions are usually prepared by adding components into solvents to become the content of solid components in the composition to be 5 to 50% by weight. Examples of the solvents include ethyl Cellosolve acetate, methyl Cellosolve acetate, ethyl Cellosolve, methyl Cellosolve, propylene glycol monomethyl ether acetate, propylene glycol ether acetate, diethylene glycol dimethyl ether, butyl acetate, ethyl lactate, ethyl pyruvate, methyl isobutyl ketone, 2-heptanone, xylene, and the like. The solvents can be used alone or in combination with at least one other kind.

It is preferable that the photoresist composition used in the present method is preliminarily filtrated for eliminating foreign objects to some extent by ordinary filter.

Examples of materials for filters used for the preliminary filtration include aliphatic polyamides, aromatic polyamides, polyether sulfones, polysulfones, sulfonated polysulfones, polyacrylonitriles, polyimides, polyvinyl alcohols, polyvinylidene fluorides, cellulose, cellulose acetates, polyethers, polytetrafluoroethylenes, polycarbonates, polypropylenes, polyethylene, polystyrenes, polyesters, ceramics, and the like. Specifically when the solution is photoresist composition, polyethylenes, polytetrafluoroethylenes and polycarbonates are preferred.

Among them, the ones having higher resistance to the solvents used are preferred. Specifically, polyethylenes and polytetrafluoroethylenes are preferred.

Though the average pore size of the filter in the preliminary filtration depends on the average pore size of filters used for measurement of Clogging Degree, it is usually 0.2 to 5 times, preferably 0.5 to 2 times larger than that for measurement of Clogging Degree. Specifically, it is usually about 0.02 to 0.5 μm, preferably 0.02 to 0.1 μm.

The preliminary filtration can be done by any conventional filtrating methods such as pressure filtration, natural filtrations, reduced pressure filtration, and the like, and pressure filtration is preferred from the view point of productivity.

In the case of photoresist compositions, the photoresist composition is to be applied onto a substrate such as a silicon wafer by a conventional process such as spin coating. A resist film applied onto the substrate and then dried is subjected to exposure for patterning, then heat-treated for facilitating a deblocking reaction, and thereafter developed with an alkali developer. The alkali developer used may be any one of various alkaline aqueous solutions used in the art, and generally, an aqueous solution of tetramethylammonium hydroxide or (2-hydroxyethyl)trimethylammonium hydroxide (commonly known as "choline") is often used.

In the case of formation of interlayer dielectric film patterns, after coating photosensitive resins in the predetermined thickness with rotation by using spinners, it is prebaked to form photosensitive resin film. The photosensitive resin film after prebaking is irradiated by photo irradiation method, and the like, then, developed by developing solution. The predetermined resin patterns can be obtained after rinsing, washing with water and drying. Then, hardening is carried out by heat treatment to obtain crosslinked resin patterns.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by way of examples, which are not construed to limit the scope of the present invention. The "%" and "part(s)" used to represent the content of any component and the amount of any material used in the following examples are on a weight basis unless otherwise specifically noted. The weight-average molecular weight of any material used in the following examples is a value found by gel permeation chromatography using styrene as a standard reference material.

RESIN SYNTHESIS EXAMPLE 1

Synthesis of Resin A

Into a four necked flask with replacing air by nitrogen, 2-ethyl-2-adamantyl methacrylate, 3-hydroxy-1-adamantyl methacrylate and 5-acryloyloxy-2,6-norbornanecarbolactone were charged at a molar ratio of 5:2.5:2.5 (20.0 parts: 9.5 parts:7.3 parts), and methyl isobutyl ketone in twice weight based on all monomers was added, to prepare solution. To the solution was added azobisisobutyronitrile as an initiator in a ratio of 3.0% by mol based on all monomer molar amount, and the mixture was heated at 80° C. for about 8 hours. Then, the reaction solution was poured into large amount of heptane to cause precipitation, and this operation was repeated three times, and then, the precipitate was dried. As a result, copolymer having a weight-average molecular weight of about 9,000 was obtained. This is called crude resin A.

RESIN SYNTHESIS EXAMPLE 2

Synthesis of Resin B (1) 350 g of poly(hydroxystyrene) [produced by living anion polymerization method, Weight-average molecular weight (Mw): 19000, Dispersion (Mw/Mn): 1.08] (2912 mmol calculated by using molecular weight of repeating unit derived from hydroxystyrene) and 0.053 g of p-toluenesulfonic acid monohydrate were dissolved in 2100 g of methyl isobutyl ketone. Into this solution was dropped 116.64 g of isobutyl vinyl ether for 30 minutes. After stirred at 21° C. for 90 hours, into the stirred mixture was added 0.062 g of triethylamine and the mixture was stirred for several minutes. Then, to this were added 700 g of methyl isobutyl ketone and 525 g of ion-exchanged water and the mixture was stirred for washing. Then, the washed Mixture was allowed to stand still for liquid separation to take out an organic layer portion. To the organic layer was added again 525 g of ion-exchanged water, and washing and liquid separation were conducted in the same manner as above. The washings and liquid separations were repeated three more time. Then the organic layer obtained was concentrated by evaporating 2206 g of solvent, then, to the concentrate was added 3266 g of propylene glycol monomethyl ether acetate. The solution was concentrated by evaporating 3233 g of solvent to obtain 1332 g of 29% isobutoxyethylated poly p-hydroxystyrene solution (total weight of solid components: 32.9%) was obtained. The rate of isobutoxyethylation in hydroxyl group in poly(hydroxystyrene) was analyzed by $^1$HNMR.

(2) 100 g of poly(hydroxystyrene) [produced by living anion polymerization method, Weight-average molecular weight (Mw): 19000, Dispersion (Mw/Mn): 1.08] (832 mmol calculated by using molecular weight of repeating unit derived from hydroxystyrene) and 0.016 g of p-toluenesulfonic acid monohydrate were dissolved in 600 g of methyl isobutyl ketone. Into this solution was dropped 19.4 g of isobutyl vinyl ether for 30 minutes. After stirred at 21° C. for 3 hours, into the stirred mixture was added 0.034 g of triethylamine and the mixture was stirred for several minutes. Then, to this were added 200 g of methyl isobutyl ketone and 150 g of ion-exchanged water and the mixture was stirred for washing. Then, the washed mixture was allowed to stand still for liquid separation to take out an organic layer portion. To the organic layer was added again 150 g of ion-exchanged water, and washing and liquid separation were conducted in the same manner as above. The washings and liquid separations were repeated three more time. Then, the organic layer obtained was concentrated by evaporating 581 g of solvent, then, to the concentrate was added 944 g of propylene glycol monomethyl ether acetate. The solution was concentrated by evaporating 888 g of solvent to obtain 393 g of 30% ethoxyethylated poly p-hydroxystyrene solution (total weight of solid components: 30.0%) was obtained. The rate of ethoxyethylation in hydroxyl group in poly (hydroxystyrene) was analyzed by $^1$HNMR.

(3) Reaction and washings and liquid separations were conducted in the same manner as (2) above except that the amount of ethoxy vinyl ether was changed to 28.2 g to obtain washed organic layer.

Then, the organic layer obtained was concentrated by evaporating 576 g of solvent, then, to the concentrate was added 983 g of propylene glycol monomethyl ether acetate. The solution was concentrated by evaporating 924 g of solvent to obtain 409 g of 42% ethoxyethylated poly(p-hydroxystyrene) solution (total weight of solid components: 30.0%) was obtained. The rate of ethoxyethylation in hydroxyl group in poly(hydroxystyrene) was analyzed by $^1$HNMR.

(4) 16.82 g of 29% isobutoxyethylated poly p-hydroxystyrene solution, 34.11 g of 30% ethoxyethylated poly p-hydroxystyrene solution and 81.88 g of 42% ethoxyethylated poly(p-hydroxystyrene) solution were charged and mixed to obtain resin solution. This is called crude resin B.

RESIN SYNTHESIS EXAMPLE 3

Synthesis of Resin C

Into a four necked flask with replacing air by nitrogen, 2-methyl-2-adamantyl methacrylate, 3-hydroxy-1-adamantyl methacrylate and α-methacryloyloxy-γ-butyrolactone were charged at a molar ratio of 5:2.5:2.5 (20.0 parts:10.1 parts:7.3 parts), and methyl isobutyl ketone in twice weight based on all monomers was added, to prepare solution. To the solution was added azobisisobutyronitrile as an initiator in a ratio of 3.0% by mol based on all monomer molar amount, and the mixture was heated at 80° C. for about 8 hours. Then, the reaction solution was poured into large amount of heptane to cause precipitation, and this operation was repeated three times, and then, the precipitate was dried. As a result, copolymer having a weight-average molecular weight of about 9,000 was obtained. This is called crude resin C.

REFERENCE EXAMPLE 1

25 Parts of the crude resin A obtained in Synthetic Example 1 was dissolved in 75 parts of 2-heptanone. To the solution was added 2.5 parts of activated carbon (Trade Name: CARBORAFIN, average pore size: 30 Å, specific surface area: 1500 m$^2$/g ) and the mixture was stirred for 4 hours. Then, the treated mixture was filtrated by pressure filtration using 5 μm filter made of polytetrafluoroethylene to obtain treated resin A solution.

10 Parts of treated resin A (converted to total weight of solid components), 0.25 parts of (4-methylphenyl)diphenylsulfonium perfluorobutanesulfonate, and 0.010 part of 2,6-diisopropylaniline were dissolved in a mixed solvent of 27.1 parts of propylene glycol monomethyl ether acetate, 27.1 parts of 2-heptanone (including a portion from resin solutions) and 2.9 parts of γ-butyrolactone to obtain resist composition. The composition was filtrated by 0.2 μm filter made of PTFE (polytetrafluoroethylene) and 0.1 μm filter made of UPE (Ultra High Molecular Weight Polyethylene) both produced by Nihon Mykrolis K.K. to obtain a preliminary filtered resist composition.

The preliminary filtered resist composition above was evaluated the following items. The results are shown in Table 1.

Measurement of Clogging Degree

At 23° C., the preliminary filtered resist composition is poured into a filtration equipment in which a round and track-etch membrane filter (imported by Nomura micro Science Co., Ltd., diameter: 47 mm, average pore size: 0.05 μm, thickness: 6 μm, pore density: 6×10$^8$ pores/cm$^2$) made of polycarbonate is set to a holder having volume of 100 ml made of stainless steel (produced by Nihon Mykrolis K.K.), then pressure filtration is started at a pressure of 100 kPa. The filtrate is collected on a balance (weighing machine), and weight change of the filtrate is checked every one minute. Filtration time and accumulated weight of filtrate discharged is measured and linear velocity is calculated by dividing the weight of filtrate discharged per one minute by effective filter area of 10.8 cm$^2$. Maximum value of linear velocity reached in 10 minutes after starting the filtration is defined as V1 (the linear velocity at initial standard point). The linear velocity at the point the accumulated weight of filtrate discharged reaches to 100 g (15 g converted to total weight of solid components) is measured and calculated in the same manner and is defined as V2. Clogging Degree is a value calculated by dividing V2 by V1.

Number of Minute Particles

Using an automatic minute particle analyzer (KS-41 Type, produced by Rion Co., Ltd.), number of particles having diameter of 0.2 μm or more was measured.

Number of Defects on Substrate

Using a wafer defect analyzer (KLA, produced by KLA Tencall Co., Ltd.), number of defects at coating film was measured. In table 1, "EX" means the number was less than 10, "FA" means the number was 10 to 100, and "BA" means the number was more than 100.

REFERENCE EXAMPLE 2

159.4 Parts of the crude resin B obtained in Synthetic Example 2 was dissolved in 293 parts of propylene glycol monomethyl ether acetate. To the solution was added 2.5 parts of activated carbon (Trade Name: CARBORAFIN, average pore size: 30 Å, specific surface area: 1500 m$^2$/g ) and the mixture was stirred for 4 hours. Then, the treated mixture was filtrated by pressure filtration using 5 μm filter made of polytetrafluoroethylene to obtain treated resin B solution.

13.5 Parts of treated resin B (converted to total weight of solid components), 0.5 part of bis(cyclohexylsulfonyl)diazomethane, 0.2 part of 4-methylphenyldiphenylsulfonium tosylate, 0.01 part of N-methyldicyclohexylamine, 0.005 part of tetramethylammonium hydroxide, 0.135 part of polypropylene glycol 1000, 0.011 part of succimide, 0.15 part of dimethyl hydantoin and 0.15 part of dimethylimidazolidinone were dissolved in a mixed solvent of 113.0 parts of propylene glycol monomethyl ether acetate (including a portion from resin solutions), and 3.2 parts of γ-butyrolactone to obtain resist composition. The composition was filtrated by 0.1 μm filter made of PTFE (polytetrafluoroethylene) and 0.05 μm filter made of UPE (Ultra High Molecular Weight Polyethylene) both produced by Nihon Mykrolis K.K. to obtain a preliminary filtered resist composition.

The preliminary filtered resist composition above was evaluated the same items as Example 1 in the same manner. The results are shown in Table 1.

REFERENCE EXAMPLE 3

Experiment and evaluation were conducted in the same manner as in Reference Example 1 except the treated resin A was changed to the crude resin A. The results are shown in Table 1.

REFERENCE EXAMPLE 4

Experiment and evaluation were conducted in the same manner as in Reference Example 2 except the treated resin B was changed to the crude resin B. The results are shown in Table 1.

TABLE 1

|  | Ref. Ex. 1 | Ref. Ex. 2 | Ref. Ex. 3 | Ref. Ex. 4 |
|---|---|---|---|---|
| Clogging Degree | 1.0 | 0.9 | 0.0 | 0.7 |
| Number of minute particles >0.2 μm/ml | 87 | 352 | 165 | 420 |
| Number of Defects | EX | EX | BA | FA |

EXAMPLE 1

20 Parts of the crude resin C obtained in Synthetic Example 3 was dissolved in 80 parts of propylene glycol monomethyl ether acetate. To the solution was added 2.5 parts of activated carbon (Trade Name: CARBORAFIN, average pore size: 30 Å, specific surface area: 1500 m$^2$/g ) and the mixture was stirred for 4 hours. Then, the treated mixture was filtrated by pressure filtration using 5 μm filter made of polytetrafluoroethylene to obtain treated resin C solution.

10 Parts of treated resin C (converted to total weight of solid components), 0.2 part of (4-methylphenyl)diphenyl-sulfonium trifluoromethanesulfonate, and 0.015 part of 2,6-diisopropylaniline were dissolved in 57.0 parts of propylene glycol monomethyl ether acetate and 3.0 parts of γ-butyro-lactone to obtain crude resist composition. The composition was filtrated by 0.1 μm filter made of PTFE (polytetrafluo-roethylene) and 0.05 μm filter made of UPE (Ultra High Molecular Weight Polyethylene) both produced by Nihon Mykrolis K.K. to obtain a preliminary filtered resist composition.

Clogging Degree of the preliminary filtered resist composition was measured in the same manner as in Reference Example 1. The value of Clogging Degree was 1.0. Referring to the results of Reference Examples 1 to 5 (Table 1), estimation of quality of coating film formed by using the composition was done by estimation of number of defects on the coating film. The estimation of number of defects was to be EX (less than 10), and estimation of quality of the composition was to be Excellent. After the estimation, the composition was actually evaluated after formation of coating film in the same manner as in Reference Example 1. The actual defects on the coating film was EX (less than 10). And the actual evaluation of the composition was Excellent.

EXAMPLE 2

Experiment and measurement of Clogging Degree of the composition were conducted in the same manner as in Example 1 except the treated resin C was changed to the crude resin C. The value of Clogging Degree was 0.5. Referring to the results of Reference Examples 1 to 5 (Table 1), estimation of quality of coating film formed by using the composition was done by estimation of number of defects on the coating film. The estimation of number of defects was to be FA (10 to 100) or BA (more than 100), and estimation of quality of the composition was to be Fair or Bad.

After the estimation, the composition was actually evaluated after formation of coating film in the same manner as in Reference Example 1. The actual defects on the coating film was BA (more than 100). And the actual evaluation of the composition was Bad.

According to the present method, quality of coating films can be figured out without actual formation of the coating films. The method capable of evaluating solutions for coating film for semiconductors can be provided.

What is claimed is:

1. A method for evaluating a solution for a coating film for semiconductor, which comprises measuring Clogging Degree of a solution for a coating film for semiconductor when the solution is filtrated through a filter having an average pore size of 0.01 to 0.4 μm, and
    estimating quality of the coating film formed from the solution,
    wherein the Clogging Degree is defined by the following formula:

Clogging Degree=$V2/V1$

V1: A value of linear velocity of filtrate (filtrating rate per 1 cm$^2$ of filter (g/(cm$^2$·min)) at initial standard point in the case that a solution is filtrated at a fixed pressure and temperature
    V2: A value of linear velocity of filtrate at the point the predetermined weight of filtrate discharged from the initial standard point.

2. The method according to claim 1, wherein the solution for a coating film for semiconductor is a photoresist composition.

3. The method according to claim 1, wherein the solution for a coating film for semiconductor is a photoresist composition for KrF or for ArF.

4. The method according to claim 1, wherein the filter is a track-etch membrane filter.

5. The method according to claim 1, wherein the average pore size of the filter is 0.01 to 0.2 μm.

6. The method according to claim 1, wherein the predetermined weight of the filtrate discharged from the initial standard point is 0.1 to 10 g per 1 cm$^2$ of the filter convened to total weight of solid components in the filtrate.

* * * * *